(12) United States Patent
Ouyang

(10) Patent No.: US 7,436,059 B1
(45) Date of Patent: Oct. 14, 2008

(54) THERMOELECTRIC COOLING DEVICE ARRAYS

(75) Inventor: Chien Ouyang, San Jose, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 11/601,527

(22) Filed: Nov. 17, 2006

(51) Int. Cl.
*H01L 23/34* (2006.01)

(52) U.S. Cl. .................. 257/712; 257/713

(58) Field of Classification Search ........... 257/712, 257/713, 718
See application file for complete search history.

(56) References Cited

U.S. PATENT DOCUMENTS

| | | | |
|---|---|---|---|
| 5,032,897 | A | 7/1991 | Mansuria et al. |
| 5,195,102 | A | 3/1993 | McLean et al. |
| 5,220,171 | A | 6/1993 | Hara et al. |
| 5,724,818 | A | 3/1998 | Iwata et al. |
| 5,918,469 | A | 7/1999 | Cardella |
| 5,921,087 | A | 7/1999 | Bhatia et al. |
| 5,960,866 | A | 10/1999 | Kimura et al. |
| 6,094,919 | A | 8/2000 | Bhatia et al. |
| 6,233,959 | B1 | 5/2001 | Kang et al. |
| 6,233,960 | B1 | 5/2001 | Kang et al. |
| 6,250,085 | B1 | 6/2001 | Tousson |
| 6,338,251 | B1 | 1/2002 | Ghoshal et al. |
| 6,424,533 | B1 | 7/2002 | Chu et al. |
| 6,453,678 | B1 | 9/2002 | Sundhar |
| 6,463,743 | B1 | 10/2002 | Laliberté |
| 6,512,291 | B2 * | 1/2003 | Dautartas et al. ............ 257/706 |
| 6,559,538 | B1 | 5/2003 | Pomerene et al. |
| 6,581,388 | B2 | 6/2003 | Novotny et al. |
| 6,645,786 | B2 | 11/2003 | Pomerene et al. |
| 6,658,861 | B1 | 12/2003 | Ghoshal et al. |
| 6,708,501 | B1 | 3/2004 | Ghoshal et al. |
| 6,711,904 | B1 | 3/2004 | Law et al. |

(Continued)

FOREIGN PATENT DOCUMENTS

JP    1995407202094    2/1997

OTHER PUBLICATIONS

Snyder, G. Jeffrey, et al. "Hot Spot Cooling Using Embedded Thermoelectric Coolers", Nextreme Thermal Solutions, Research Triangle Park, NC, 22$^{nd}$ IEEE Semi-Therm Symposium, 2006 (9 pgs. beginning on p. 135).

(Continued)

*Primary Examiner*—Roy K Potter
(74) *Attorney, Agent, or Firm*—Meyertons Hood Kivlin Kowert & Goetzel, P.C.; B. Noël Kivlin; Russell E. Henrichs

(57) ABSTRACT

In various embodiments, a TEC device array may be coupled to a chip and a heat sink to cool the chip. The TEC device array may include multiple TEC devices separately controlled to provide different cooling rates at different points in the TEC device array coupled to the chip. In some embodiments, temperature data for areas on the chip or for separate electronic components may be determined using one or more thermal sensors and then sent to a controller. The controller may then determine an appropriate response for the TEC devices in the TEC device array near the area of the thermal sensor(s). The controller may thus control the cooling rates (which may be different) of several TEC devices in the TEC device array.

20 Claims, 14 Drawing Sheets

U.S. PATENT DOCUMENTS

| | | | |
|---|---|---|---|
| 6,743,972 | B2 | 6/2004 | Macris |
| 6,917,522 | B1 | 7/2005 | Erturk |
| 6,950,773 | B1 | 9/2005 | Gross et al. |
| 7,002,801 | B2 | 2/2006 | Zeighami et al. |
| 7,020,802 | B2 | 3/2006 | Gross et al. |
| 7,076,389 | B1 | 7/2006 | Gross et al. |
| 7,085,681 | B1 | 8/2006 | Williams et al. |
| 2003/0085024 | A1 | 5/2003 | Santiago et al. |
| 2004/0182088 | A1 | 9/2004 | Ghoshal et al. |
| 2004/0234379 | A1 | 11/2004 | Miner et al. |
| 2004/0234392 | A1 | 11/2004 | Ghoshal et al. |
| 2004/0251539 | A1* | 12/2004 | Faris et al. .................. 257/712 |
| 2005/0150535 | A1 | 7/2005 | Samavedam et al. |
| 2005/0150536 | A1 | 7/2005 | Ngai et al. |
| 2005/0150537 | A1 | 7/2005 | Ghoshal |
| 2005/0150539 | A1 | 7/2005 | Ghoshal et al. |
| 2005/0160752 | A1 | 7/2005 | Ghoshal et al. |
| 2005/0189089 | A1 | 9/2005 | Miner |

OTHER PUBLICATIONS

Thermocore Thermal Management Solutions, Advanced Cooling Solutions for a Changing World, Electronics Cooling Group of Modine Applied Thermal Innovation, Modine Manufacturing Company, 2005 (12 pgs).

Venkatasubramanian, Rama, et al. "Thin-Film Thermoelectric Devices with High Room-Temperature Figures of Merit", Macmillan Magazines Ltd, Nature, vol. 413, Oct. 11, 2001, www.nature.com, Research Triangle Institute, Research Triangle Park, NC (pp. 597-602).

Moore, Bruce D. "IC Temperature Sensors Find the Hot Spots", Maxim Integrated Products, www.ednmag.com, EDN Jul. 2, 1998, Sunnyvale, CA (pp. 99-110).

Maxim "± 1° C., SMBus-Compatible Remote/Local Temperature Sensors with Overtemperature Alarms", Maxim Integrated Products, Sunnyvale, CA MAX6657/MAX6658/MAX6659, www.maxim-ic.com, Rev. 4; May 2006 (pp. 1-17).

Dallas Semiconductor Maxim "MAX6657, MAX6658, MAX6659" Overview: ± 1° C., SMBus-Compatible Remote/Local Temperature Sensors with Overtemperature Alarms, Maxim Integrated Products, 2006 (2 pgs.).

Hughes, Ronnie D. "Remote Diodes Yield Accurate Temperature Measurements", National Semiconductor, Jul. 10, 2003, Located on Manufacturing.net at http://www.manufacturing.net/article/CA307863?ticker=NSM on Feb. 1, 2004 (4 pgs.).

U.S. Appl. No. 11/523,435 filed on Sep. 19, 2006.

"TEC Integrated Heat Sinks", *Enĕrtron Custom Design & Manufacturing of Thermal Management Systems*; Enĕrtron, Inc., Mesa, AZ., 2002, 1 pg.

"Laser Module Cooling, Design Goals and Constraints", *Enĕrtron Total Thermal Management Solutions*; Enĕrtron, Inc., Mesa, AZ., 2002, 1 pg.

"Heat pipes for electronics cooling applications", by Scott D. Garner, PE. *Electronics Cooling*, Thermacore Inc., Lancaster, PA., 2001, 10 pgs.

"SubZero4G™ Thermo-Electric Cooling", *Thermaltake SubZero4G Thermo-Electric Cooling*; Thermaltake Technology Co., Ltd., City of Industry, CA., 2003, 6 pgs.

"The Cooligy Electrokinetic Pump"; http://web.archive.org/web/20040630060103/www.cooligy.com/electrokinetic_pump.html, dated Jul. 25, 2004, 2 pgs.

"Advanced Microchannel Cooling Loop"; http://web.archive.org/web/20040725041209/www.cooligy.com/micro_channel_cooling.html, dated Jul. 25, 2004, 4 pgs.

"Microchannel Cooling"; http://web.archive.org/web/20040619033221/www.cooligy.com/microchannels.html, dated Jul. 25, 2004, 3 pgs.

U.S. Appl. No. 10/941,115 Entitled, "Integrated Circuit Cooling Apparatus and Method", filed Sep. 15, 2004.

* cited by examiner

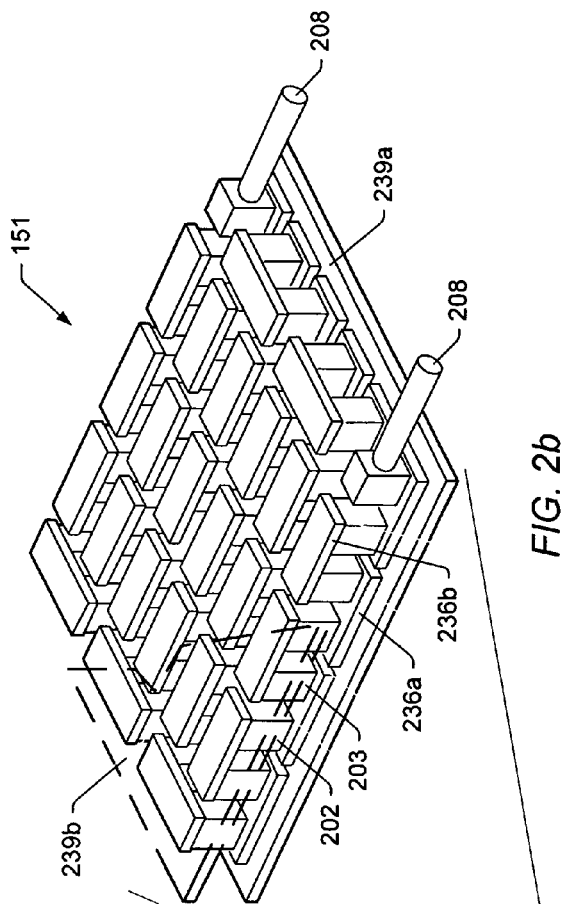
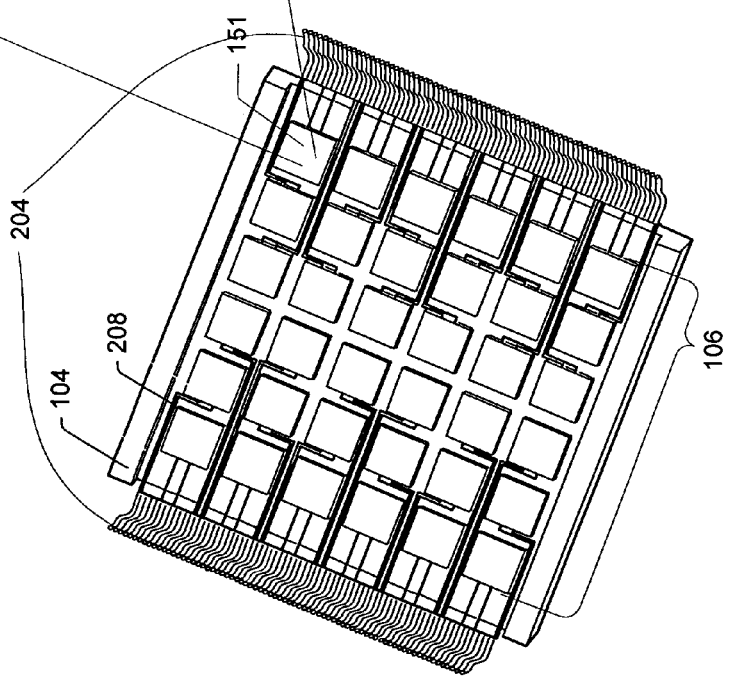
FIG. 2b
FIG. 2a

THERMOELECTRIC COOLING DEVICE ARRAYS

BACKGROUND OF THE INVENTION

1. Field of the Invention

The present invention relates generally to electronic cooling and, more specifically, to thermoelectric cooling devices.

2. Description of the Related Art

Chips, such as microprocessors, may generate significant heat during operation. High temperatures may reduce the lifespan of these chips, and, therefore, the generated heat may need to be dispersed to keep the operating temperature of the chips within acceptable limits. Heat sinks may be coupled to chips to absorb heat through the heat sink base and disperse the heat through their fins. In addition, a single thermoelectric cooling (TEC) device has been used to pump heat away from the chip.

The basic concept behind thermoelectric cooling technology is the Peltier effect. The Peltier effect occurs whenever electrical current flows through two dissimilar conductors. Depending on the direction of current flow, the junction of the two conductors will either absorb or release heat. By arranging N and P-type semiconductor pellets (e.g., Bismuth Telluride) in an alternating array and forming a junction between the N and P-type pellet pairs with a plated copper tab, it is possible to configure a series circuit (in a TEC device) that can keep all of the heat moving in the same direction. With a free end of a P-type pellet connected to a positive voltage potential and a free (bottom) end of the N-type pellet similarly connected to the negative side of the voltage, heat can be pumped from one side of the TEC device to the other. As one example, a TEC device may have 254 alternating pellets connected to a 12-16 VDC supply drawing 4-5 amps.

Chips may have localized spots of increased temperature ("hot spots"). While cooling the entire chip with one TEC device results in some cooling of the hot spots, it may also lead to overcooling other areas of the chip.

SUMMARY OF THE INVENTION

In various embodiments, a TEC device array may be coupled to a chip (an electronic element) to cool the chip. The TEC device array may include multiple TEC devices, for example, arranged in an array. The TEC devices in the TEC device array may be separately controlled (e.g., by a controller) to provide different cooling rates at different points in the TEC device array. In some embodiments, the TEC device array may be coupled to the chip and to a heat sink to move heat from the chip to the heat sink. In some embodiments, the TEC device array may be coupled to a bottom portion of a package lid that is placed over the chip and coupled to the heat sink through the top portion. The TEC device array may also be coupled to the top portion of the package lid or to the chip itself. A layer of thermal interface material may be placed between the TEC device array and the chip to facilitate heat transfer.

In some embodiments, temperature data for areas on the chip or for separate electronic components may be determined using one or more thermal sensors. The temperature data may be sent to a controller, and the controller may determine an appropriate response for the TEC devices in the TEC device array near the area of the thermal sensor(s). If the temperature is above a first threshold, the controller may increase the cooling rate of the TEC device(s) near the thermal sensor. If the temperature is below a second threshold, the controller may decrease the cooling rate of the TEC device near the thermal sensor.

In some embodiments, the controller may control the cooling rate of the TEC device(s) through specifying operating parameters for the TEC devices and/or controlling power to the TEC devices. For example, if the controller determines that a specific TEC device needs to increase its cooling rate, the controller may directly increase the power supplied to the TEC device by increasing the current to the TEC device. The controller may thus separately control the cooling rates (which may be different) of the TEC devices in the TEC device array.

BRIEF DESCRIPTION OF THE DRAWINGS

A better understanding of the present invention may be obtained when the following detailed description is considered in conjunction with the following drawings, in which:

FIG. 2a illustrates the bottom of a package lid with an embedded TEC device array, according to an embodiment;

FIG. 2b illustrates a TEC device, according to an embodiment;

Figure 1:
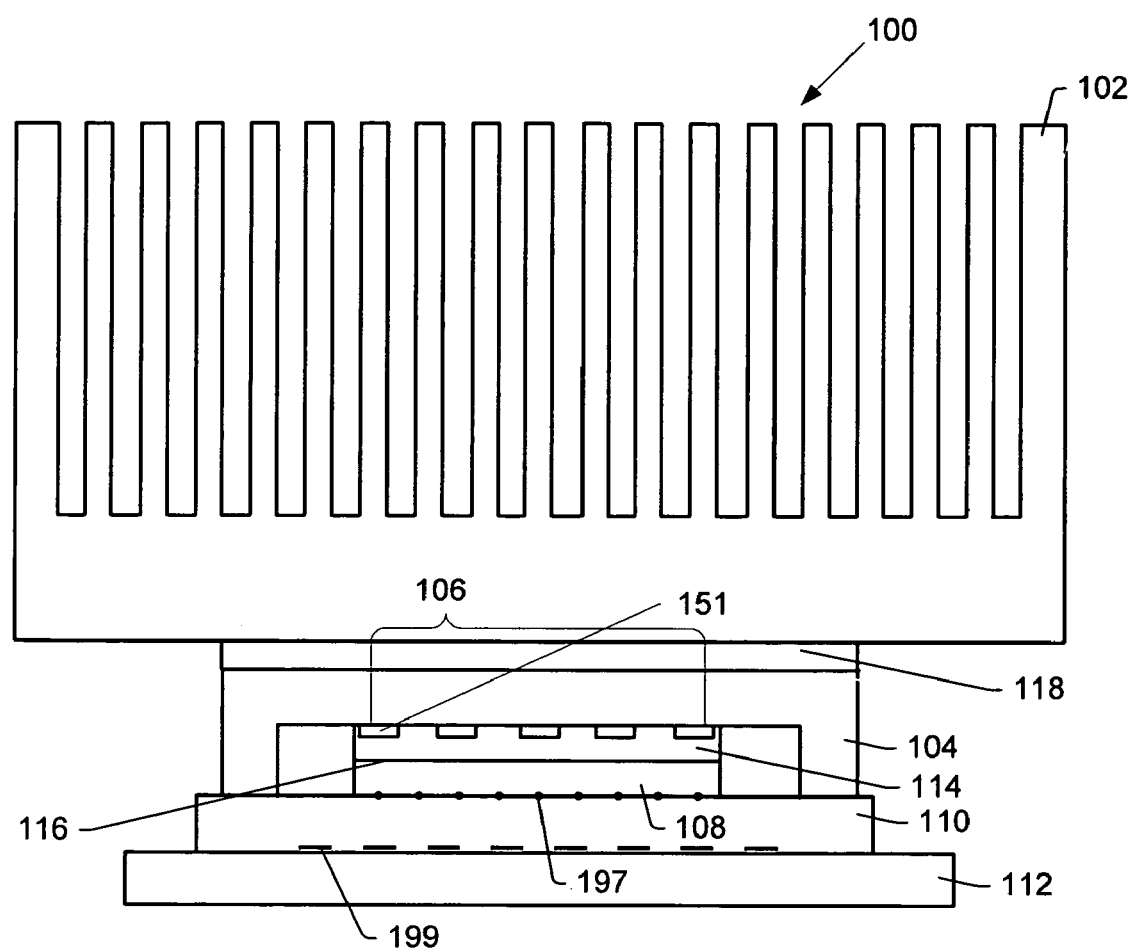
FIG. 1 illustrates a thermoelectric cooling (TEC) device array coupled to a chip and a heat sink, according to an embodiment.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims. Note, the headings are for organizational purposes only and are not meant to be used to limit or interpret the description or claims. Furthermore, note that the word "may" is used throughout this application in a permissive sense (i.e., having the potential to, being able to), not a mandatory sense (i.e., must). The term "include", and derivations thereof, mean "including, but not limited to". The term "coupled" means "directly or indirectly connected".

DETAILED DESCRIPTION OF THE INVENTION

FIG. 1 illustrates an embodiment of a TEC device array 106 (which includes TEC devices 151) coupled to a chip 108 and a heat sink 102. The TEC device array 106 may include multiple TEC devices 151 arranged in a uniform or non-uniform pattern for removing heat from the chip 108. TEC device array 106 may include multiple TEC devices 151 of similar or different sizes. TEC device array 106 refers generally to an array of TEC devices 151. Different embodiments of TEC devices 151 and TEC device arrays 106 are presented throughout with different letter designators (e.g., TEC device 151a,b and TEC device arrays 106a,b). It is noted that different lettered embodiments of the TEC devices 151 and TEC device arrays 106 may be of similar size and configuration as other TEC devices 151 and TEC device arrays 106 presented (or may be different).

In some embodiments, the chip 108 may be, for example, an electronic element such as a microprocessor, a digital signal processor, or a graphics-processing unit. Other chips 108 are also contemplated (e.g., other power-handling semiconductors). The chip 108 may have multiple electronic components (e.g., microprocessor components) embedded in a die mounted on a substrate 110. For example, the chip 108 may be a microprocessor with multiple microprocessor components. The chip 108 may be coupled to the substrate 110 through solder balls 197 or socket pins. Chip 108 is used generally herein to refer to chips throughout different embodiments (and may refer to chips of similar or different configurations). In some embodiments, the chip 108 may emit heat during operation in a non-uniform pattern over a surface 116 of the chip 108. The non-uniform pattern may include at least one lower heat generation area and at least one higher heat generation area. The TEC devices 151 of the TEC device array 106 may be arranged according to the lower and higher heat generation areas. For example, a TEC device 151 of the TEC device array 106 may be arranged on top of at least one higher heat generation area (while lower heat generation areas may share a TEC device 151 in the TEC device array 106). Other distributions are also possible. In some embodiments, the non-uniform heat emission pattern may change over time. A controller (e.g., controller 303 in FIG. 3) coupled to the TEC devices 151 in the TEC device array 106 may adjust the amount of heat transferred from separate TEC devices 151 in the TEC device array 106 in response to the change of the non-uniform heat emission pattern to increase the heat transfer of TEC devices 151 in the TEC device array 106 near the higher heat generation areas. In some embodiments, the controller 303 may thus maintain a uniform temperature and/or heat generation rate across a surface 116 of the chip 108 by dynamically controlling (e.g., increasing or decreasing) cooling rates of TEC devices 151 in the TEC device array 106 as needed near areas of the chip 108 which thermally drift from the uniform temperature and/or heat generation rate. In some embodiments, the controller 303 may quickly control the TEC devices 151 in the TEC device array 106 to respond (e.g., in less than one second) to changes in the non-uniform heat emission pattern.

In some embodiments, the TEC device array 106 may be coupled to the chip 108 and to the heat sink 102 to move heat from the chip 108 to the heat sink 102. In some embodiments, the TEC device array 106 may be coupled to a bottom portion of a package lid 104 that is placed over the chip 108 and coupled to the heat sink 102. A layer of thermal interface material 114 (e.g., carbon black paste, silver paste, aluminum paste, or a thermal interface pad) may be placed between the TEC device array 106 and the chip 108 to facilitate heat transfer. Other thermal interface materials may also be used. In some embodiments, a thermal interface material may not be used. Other locations for the thermal interface material are also contemplated. For example, a layer 118 of thermal interface material may be used between the package lid 104 and the heat sink 102. The TEC device array 106 may also be coupled to the top portion of the package lid 104 or to the chip 108 itself. Other locations of the TEC device array 106 are also contemplated (e.g., below the chip 108). As another example, the TEC device array 106 may be coupled to the heat sink 102 through a layer of thermal interface material without using a package lid 104.

FIG. 2a illustrates the bottom of an embodiment of the package lid 104 with a TEC device array 106. The TEC device array 106 may be formed onto the bottom of the package lid 104 through a photomasking process. Other methods of coupling the TEC device array 106 are also contemplated (e.g., forming the TEC device array 106 separately and bonding the TEC device array 106 to the package lid 104 or chip 108 through adhesive). The electrical lines 208 for the TEC devices 151 of TEC device array 106 may also be formed by photomasking the package lid 104. In addition, other methods of forming the electrical lines 208 are also possible (e.g., forming them as separate wires bonded to the TEC devices 151). The electrical lines 208 may be coupled to electrical leads 204 for coupling to the controller 303. The electrical leads 204 may be coupled directly to the controller 303, or may be coupled to the controller indirectly (e.g., through leads on a printed circuit board (PCB) 112 (see FIG. 1)). For example, the electrical leads 204 may be soldered directly to controller 303 or may be soldered to electrical contacts 199 on the PCB 112 (the electrical leads 204 are not shown on FIG. 1 in order to display other elements on the assembly 100).

As seen in FIG. 2b, the TEC devices 151 may include multiple N-type semiconductor pellets 203 and P-type semiconductor pellets 202 arranged in mating pairs with alternating pair members coupled through a top conductor 236b or bottom conductor 236a. The conductors 236a,b may be plated copper tabs. Other conductors 236a,b are also contemplated. In some embodiments, the pellets/conductors may be coupled to a ceramic substrate on the top (e.g., substrate 239b) and bottom (e.g., substrate 239a). Other substrate materials are also contemplated. In some embodiments, the TEC device 151 may not have the ceramic substrate 239a,b. The TEC devices 151 may be coupled to electrical lines 208 for power.

Figure 3:
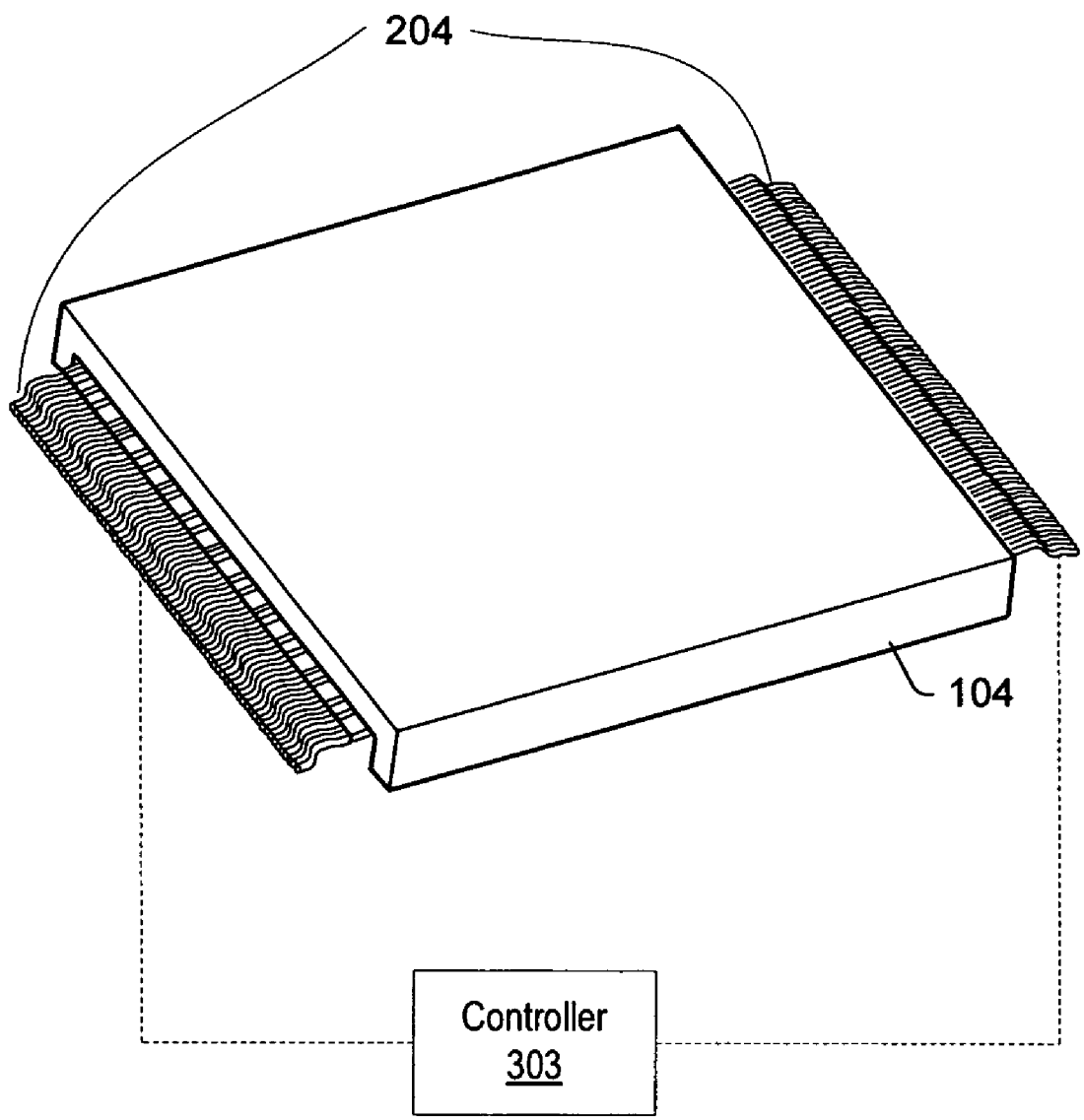
FIG. 3 illustrates the top of a package lid with an embedded TEC device array, according to an embodiment.

FIG. 3 illustrates the top of an embodiment of package lid 104 with an embedded TEC device array 106 on the bottom surface of the package lid 104. The TEC device array 106 may be coupled to electrical leads 204 on the sides of the package lid 104. These electrical leads 204 may be coupled to the PCB 112 to which the chip 108 is coupled. In some embodiments, the TEC devices 151 cooling rate may be controlled by modifying the amount of power to the TEC devices 151 through the electrical leads 204 and through the electrical lines 208 (e.g., by varying supplied current). The TEC device array 106 may be electrically coupled to the controller 303 (e.g., a memory-in memory-out (MIMO) controller). The controller 303 may be implemented in a central processing unit (CPU) (e.g., on chip 108) or may be a separate device (e.g., a device coupled to the PCB 112). Other locations for the controller 303 are also possible. The controller 303 may analyze the temperatures and/or heat generation rates of different areas of the chip (e.g., collected through thermal sensors in these areas) and control, for example, the current supplied to individual TEC devices 151 in the TEC device array 106 in response to the detected temperatures and/or heat generation rates.

Figure 4A:
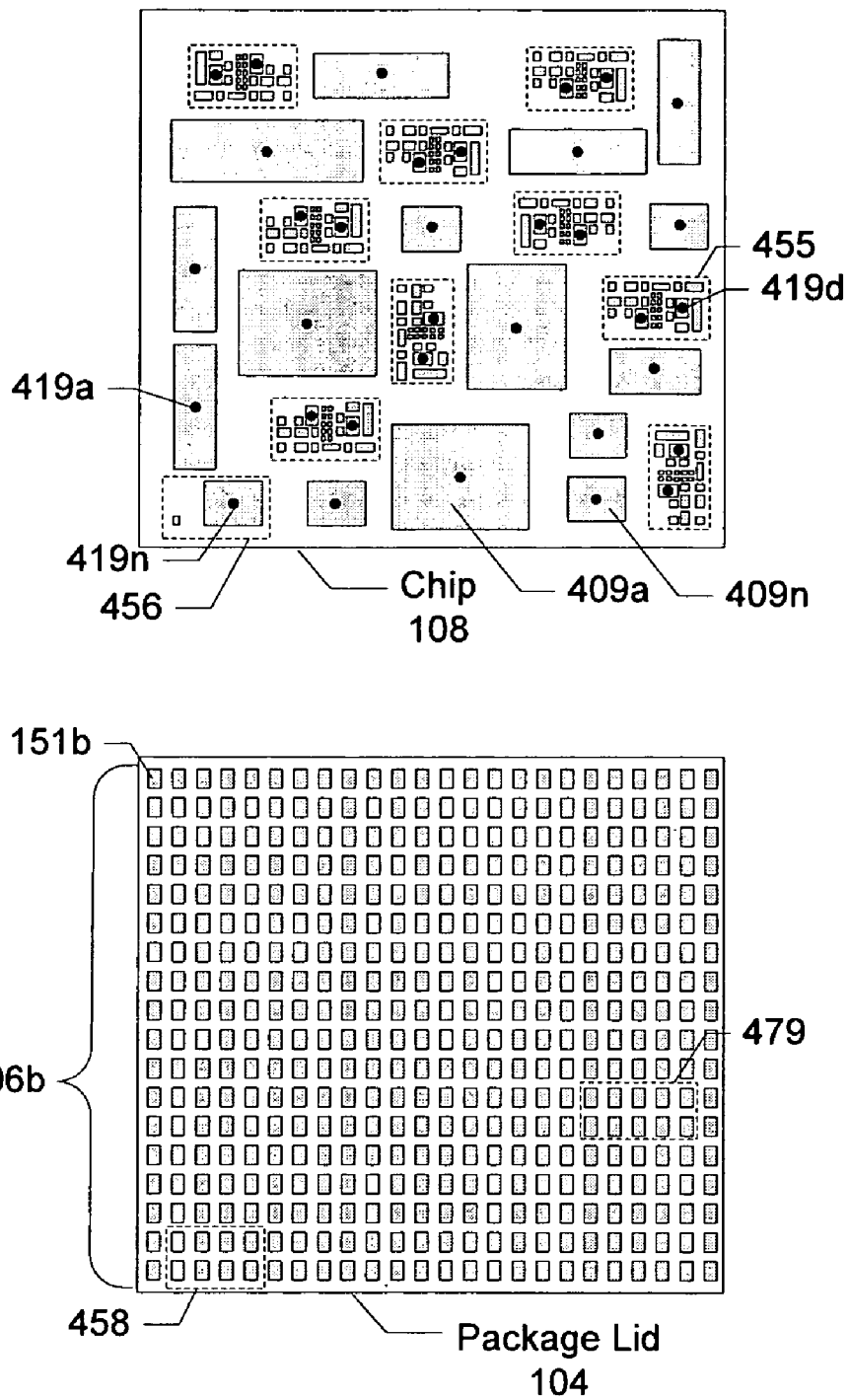
FIGS. 4a-c illustrate various electronic component arrangements and corresponding TEC device array arrangements; according to an embodiment.
Figure 4B:
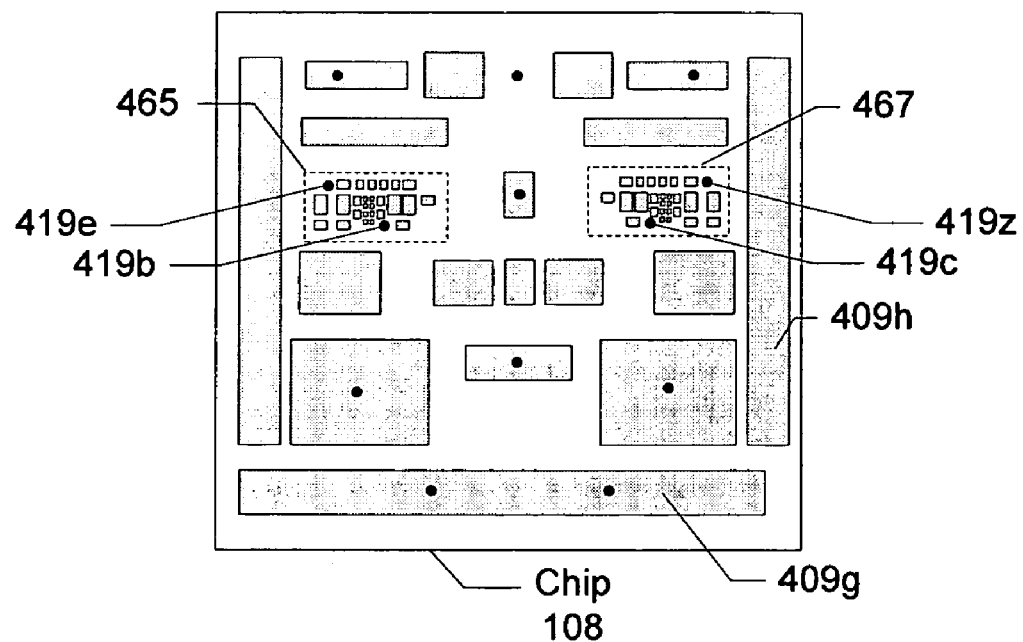
Figure 4B:
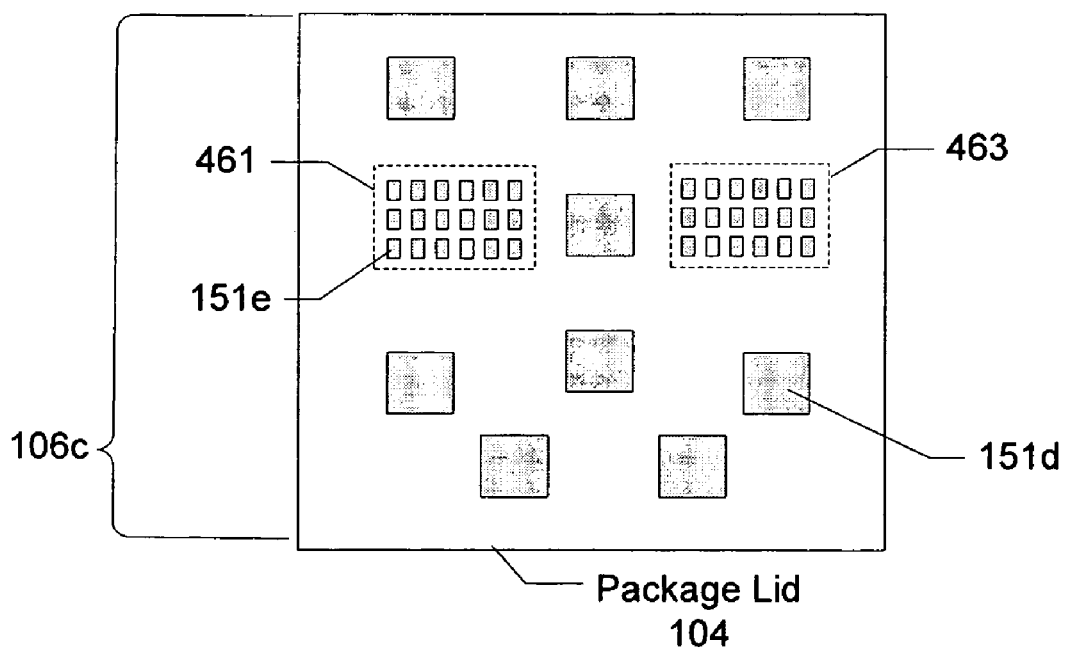
Figure 4C:
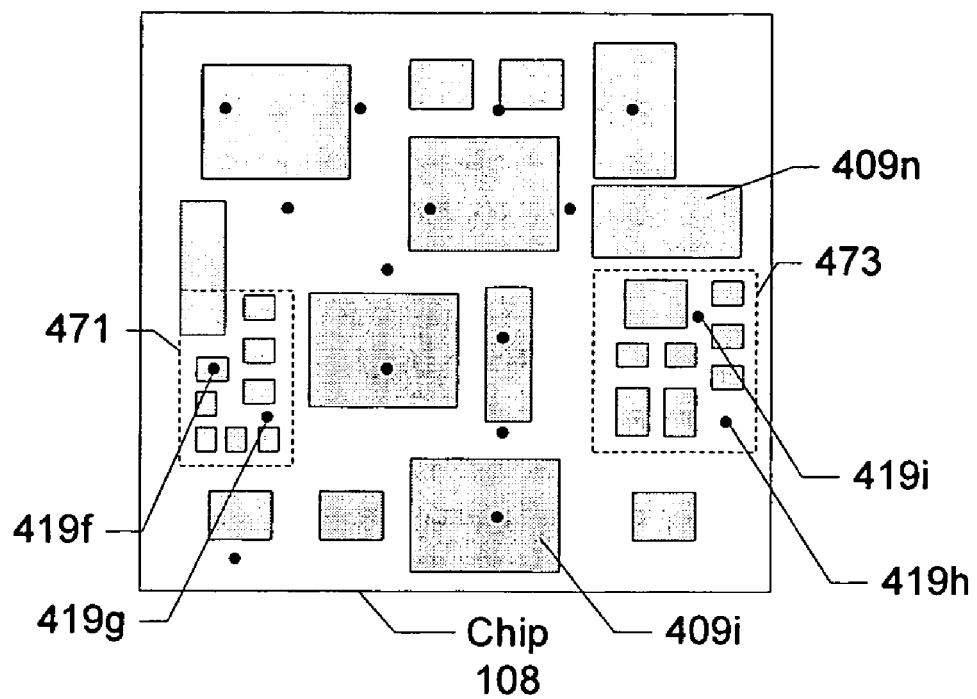
Figure 4C:
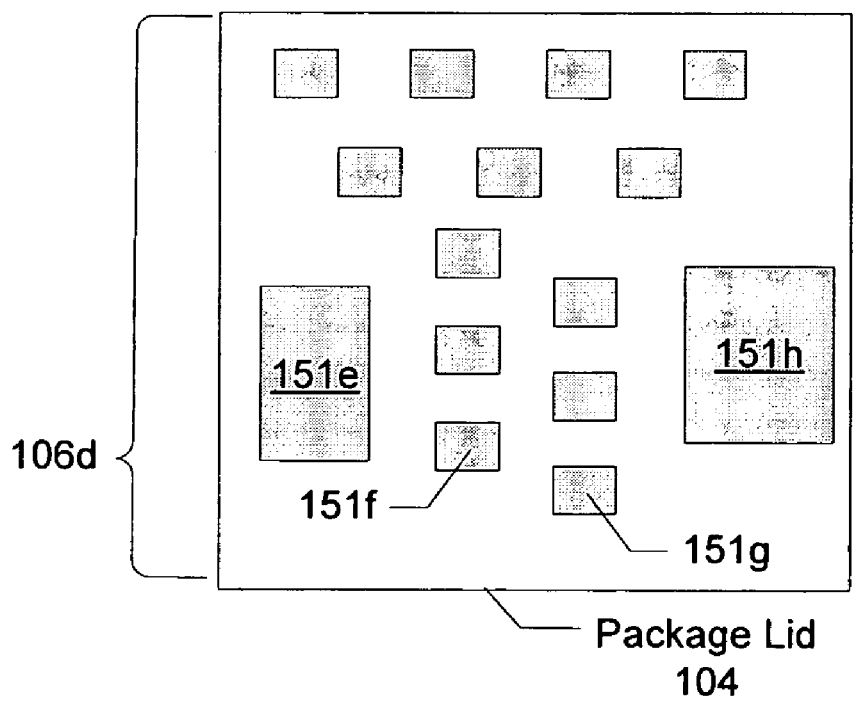

FIGS. 4a-c illustrate various embodiments of chip configurations and corresponding TEC device arrays. As seen in FIG. 4a, the TEC device array 106b may be a uniform array of TEC devices 151b placed on the package lid 104 for chip 108 (with electronic components 409).

In some embodiments, thermal sensors 419 (e.g., thermal sensors 419a,n) may be placed on the chip 108. In some embodiments, thermal sensors 419 may include thermocouples, resistance temperature devices (RTDs), infrared temperature measurement devices, bimetallic temperature measurement devices, or fluid expansion temperature measurement devices. Other thermal sensor types are also contemplated. In some embodiments, the thermal sensors 419 may measure localized temperatures (e.g., measure temperature of the areas immediately surrounding them). The thermal sensors 419 may be embedded in the electronic components 409 (e.g., components 409a,n), placed on the package lid 104 (e.g., through photomasking), or in some other way coupled to the chip 108. For example, the thermal sensors 419 may be embedded in microprocessor components and/or photomasked next to the microprocessor components on the surface of the microprocessor facing the TEC device array 106. The thermal sensors 419 may also be placed on the package lid 104 embedded in or placed near the TEC devices 151 in the TEC device array 106. In some embodiments, the thermal sensors 419 may be placed near predicted hot spots on the chip, or the thermal sensors 419 may be evenly distributed on the surface of the chip 108. In some embodiments, temperature data (e.g., heat generation rates, temperatures, etc.) from the thermal sensors 419 may be sent to the controller (e.g., controller 303 seen in FIG. 3). In some embodiments, the thermal sensors 419 may be coupled to, for example, a CPU on chip 108 and may communicate temperature data to the CPU. The CPU may then communicate temperature data to the controller 303. In some embodiments, the CPU may communicate control information (e.g., to control the cooling rates of the TEC devices 151 in the TEC device array 106) in place of or in addition to temperature data sent to the controller 303. The thermal sensors 419 may be electrically connected directly to the CPU or controller or may be indirectly connected (e.g., through the PCB).

In some embodiments, the controller 303 may determine the appropriate cooling rates for the TEC devices 151 based on the temperature data measured through the thermal sensors 419. In some embodiments, the CPU may determine the appropriate cooling rates for the TEC devices 151 based on the temperature data measured through the thermal sensors 419 and may send corresponding control signals to the controller 303. In some embodiments, the controller 303 functionality may be implemented directly in the CPU (e.g., without a separate controller 303).

For example, the controller 303 may receive temperature data from thermal sensor 419d indicating that the corresponding component grouping 455 of the chip 108 is operating at a temperature above a first threshold. The controller 303 may then signal the TEC devices 151b in group 479 of the TEC device array 106b to increase their cooling rate. For example, the controller 303 may directly increase the power (e.g., by increasing current) to the TEC devices 151b in group 479. In some embodiments, the controller 303 may determine an approximation of how much to increase the cooling rate of the TEC devices 151 to achieve a desired operating temperature for component grouping 455. In addition, the controller 303 may determine the appropriate responses for several (or all) of the TEC devices 151b in order to control the temperature gradient across the chip 108. In some embodiments, the chip 108 may emit heat in a non-uniform pattern over the surface of the chip 108 (e.g., as represented by the dashed line around a higher heat generation area corresponding to component grouping 455 and the dashed line around a lower heat generation area corresponding to component grouping 456). In some embodiments, the non-uniform pattern of heat emission may change over time, and the controller 303 may adjust the cooling rate of a TEC device 151 in the TEC device array 106 to counter the change in the non-uniform heat emission pattern (e.g., to maintain a substantially constant temperature across the surface of the chip 108).

As another example, thermal sensor 419n may send temperature data to the controller 303 indicating that component grouping 456 is operating below a second threshold. In some embodiments, the first threshold and the second threshold may be approximately the same (or may be different). The controller 303 may signal the TEC devices 151b in group 458 to decrease their cooling rate (or even stop cooling). For example, the controller may directly reduce or stop power to the TEC devices 151b in group 458. The reduction in cooling rate of the TEC devices 151b in group 458 may save power consumption for the TEC device array 106b.

In some embodiments, smaller TEC devices 151 may be used for more localized temperature control. For example, a group of smaller TEC devices 151 may be placed over a high temperature area of the chip 108 to drive a few of the TEC devices 151 at a much higher cooling rate than some of the other TEC devices 151 which may be near the higher temperature area but do not need to be driven at the same high cooling rate. Larger TEC devices 151 may be used where the same cooling rate is needed for a larger area on the chip 108 (e.g., if the components 409 in a certain area of the chip 108 are generating approximately the same amount of heat). In some embodiments, larger TEC devices 151 may be used for areas of high heat generation and smaller TEC devices 151 may be used in areas of lower heat generation. TEC device sizes may be determined from a manufacturing standpoint (e.g., it may be less expensive to place a few larger TEC devices 151 than to place a larger number of smaller TEC devices 151).

As illustrated in FIG. 4b, the TEC device array 106c may include various sizes and distributions of TEC devices 151. The TEC devices 151 may be arranged in an array on the package lid 104 based on the arrangement of components 409 (e.g., components 409g,h) on the chip 108 to which the package lid 104 will be coupled. For example, the TEC devices 151 may be concentrated in locations on the package lid 104 which correspond to areas of greater heat generation on the corresponding chip 108. Tight groupings 461, 463 of smaller TEC devices 151e in the TEC device array 106c may be used for corresponding component groupings 465, 467 on chip 108. Component groupings 465, 467 may be areas of tight groupings of microprocessor components that may give off more heat than other areas of the chip 108. In some embodiments, component groupings 465, 467 may not be tight groupings of electronic components, but may include high heat generating components.

In some embodiments, thermal sensors (e.g., thermal sensors 419b-e) may measure temperatures and/or heat generation rates in the component groupings 465, 467. This data may be passed to the controller 303 which may decide appropriate cooling rates for the TEC devices 151e in TEC devices 461 and 463 in TEC device array 106c. For example, the TEC devices 151e closest to thermal sensors 419b,c may have their cooling rate increased over the cooling rates of the TEC devices 151e closest to thermal sensors 419z,e (which may be detecting lower heat generation rates).

In some embodiments, components 409g and 409h may be cooler components and, therefore, corresponding TEC devices (such as TEC device 151d in the TEC device array 106c) in the cooler areas may be more spread out.

In some embodiments, the temperature of various areas of the chip 108 may not necessarily correspond to the number or arrangement of electronic components 409. For example, one electronic component may release a lot more heat than another larger component. The TEC device array 106 for the chip 108 may be arranged with respect to the temperature distribution of the chip 108 during operation. For example, the temperature distribution may be predetermined before manufacturing for arranging the TEC device array 106 (e.g., through testing and/or modeling of the chip 108). The TEC device array 106 may then be prearranged according to the predetermined temperature distribution.

FIG. 4c illustrates a chip 108 with a different arrangement of components 409 (e.g., components 409i,n). In this embodiment, component groupings 471,473 may be the areas of higher heat generation. In some embodiments, larger TEC devices 151e,h may be placed in corresponding positions in the TEC device array 106d on the package lid 104. Components such as component 409i may generate less heat and, therefore, other TEC devices (e.g., TEC device 151f,g) in the TEC device array 106d may be dispersed in a more spread out pattern. Thermal sensors 419f-i may be used to monitor the heat generation rates/temperatures of the different components and/or component groupings on the chip 108. In some embodiments, many of the components may have separate thermal sensors 419 (e.g., embedded in the component or placed near the component) to measure the heat generation rate/temperature of the components. In some embodiments, the higher heat generating components may have separate thermal sensors 419 while the lower heat generating components may share thermal sensors 419. Other thermal sensor configurations are also possible.

Figure 5:
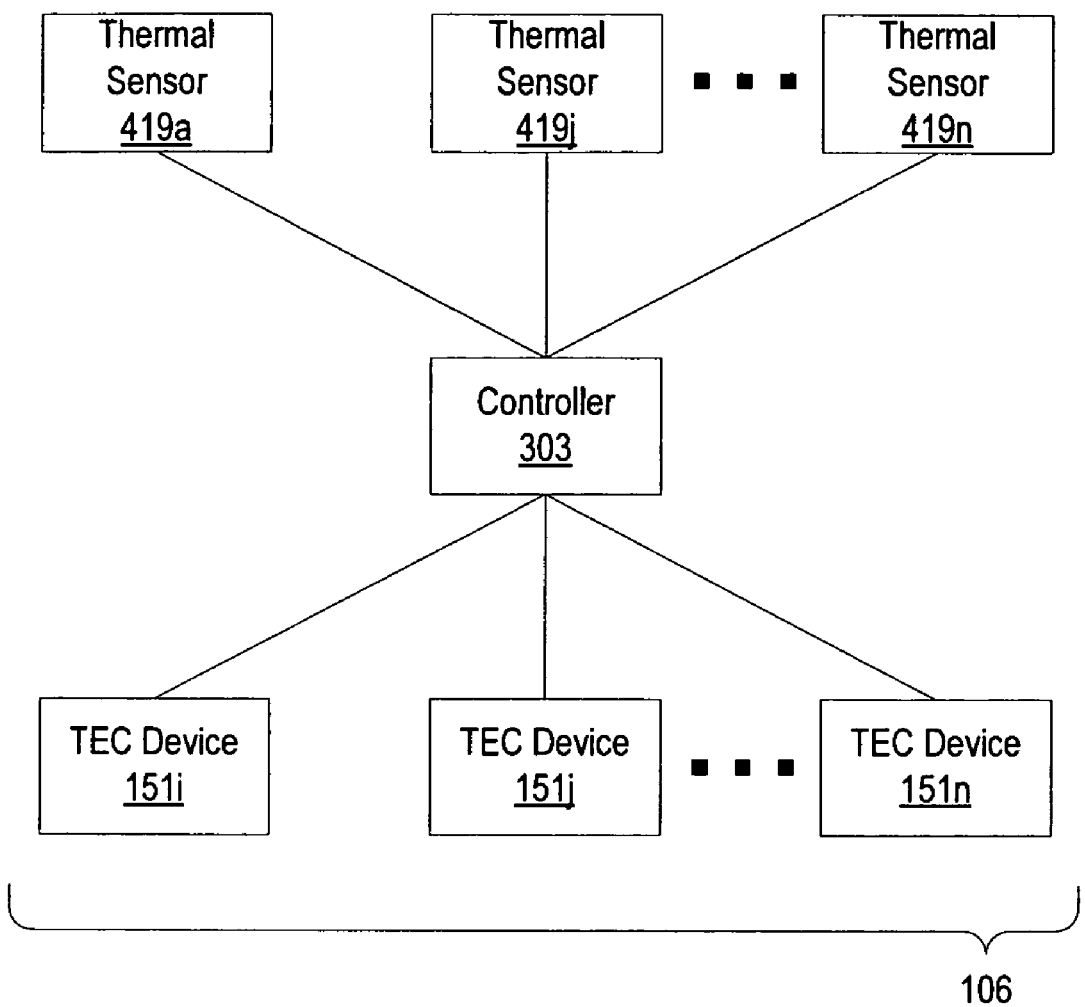
FIG. 5 illustrates a thermal sensor, controller, and TEC device array configuration, according to an embodiment.

FIG. 5 illustrates an embodiment of thermal sensors 419 (e.g., thermal sensors 419a,j, and n), controller 303, and TEC devices 151i-n in a TEC device array 106. As seen in FIG. 5, the controller 303 may be electrically coupled to TEC devices 151i-n and thermal sensors 419 through electrical pathways (e.g., electrical lines 208 and electrical leads 204 as seen in FIG. 2a). In some embodiments, the controller 303 may be a MIMO controller or may include different types of controllers. The controller 303 may include, for example, a field programmable gate array (FPGA), or other programmable devices. In some embodiments, the controller 303 may control the TEC devices 151 separately or in groups. The controller 303 may work independently or in conjunction with other controllers. In some embodiments, the controller 303 may be separate from the chip 108 or may be embedded in the chip 108 (e.g., photomasked into the chip 108). Other locations for the controller 303 are also possible (e.g., photomasked into the package lid 104 or coupled to the PCB 112). In some embodiments, the thermal sensors 419 may be embedded in the electronic components 409, on the chip 108 near the components 409, on the package lid 104, or in other locations. In some embodiments, the TEC devices 151 may be placed on the package lid 104, on the chip 108, or on other locations (e.g., below the chip 108).

Figure 6A:
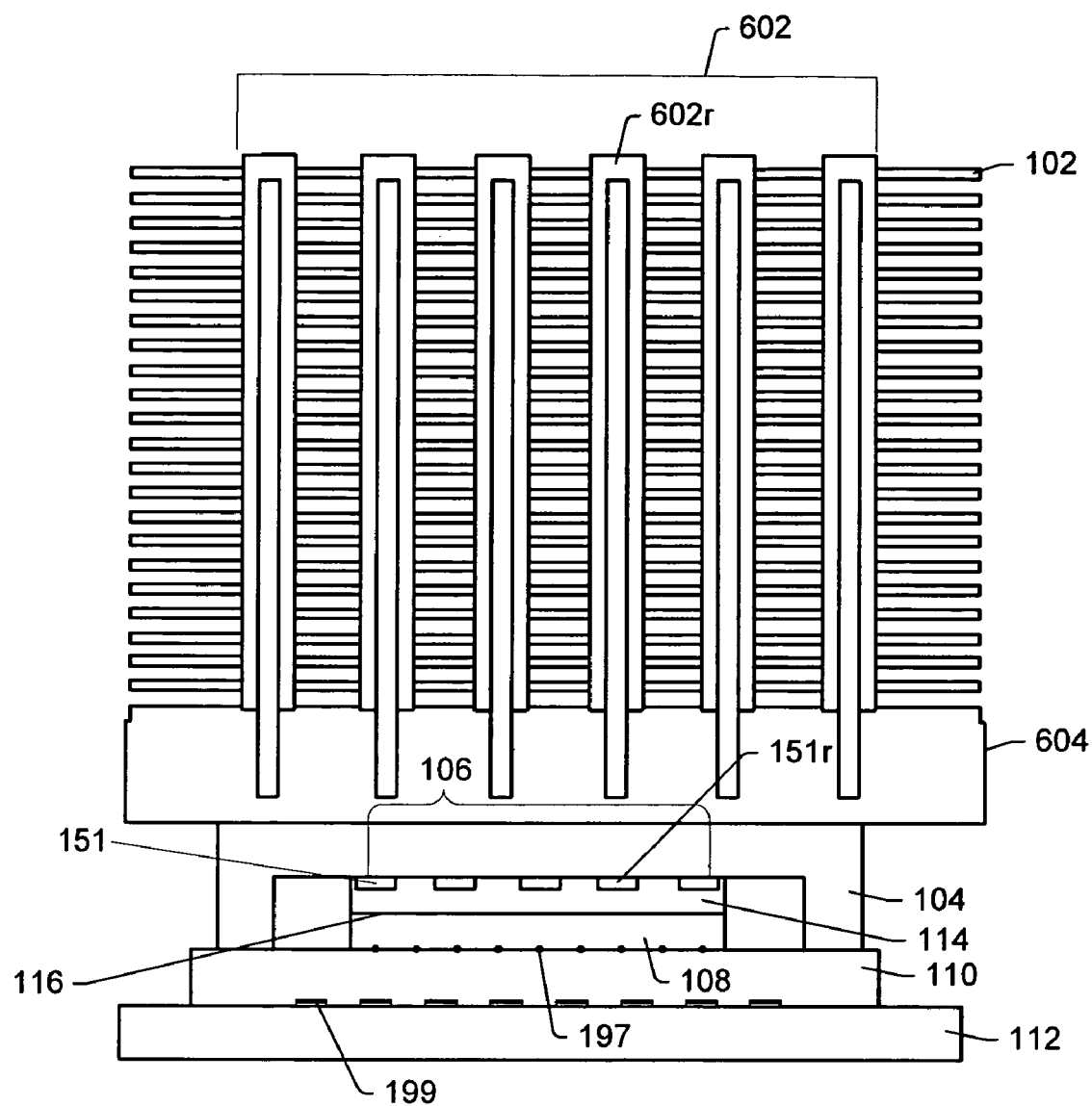
FIG. 6a illustrates a heat sink with heat pipes thermally coupled to a TEC device array, according to an embodiment.

FIG. 6a illustrates an embodiment of a cooling assembly with a heat sink 102 and heat pipes 602 (e.g., heat pipe 602r) thermally coupled through a heat sink base 604 and package lid 104 to a TEC device array 106 of TEC devices 151. In some embodiments, heat pipes 602 may be aligned with TEC devices 151 in the TEC device array 106. In some embodiments, the heat pipes 602 may be aligned with specific TEC devices 151 or aligned with specific groups of TEC devices 151. For example, a heat pipe 602r may be aligned with TEC device 151r in an area of the chip 108 with high heat generation. In some embodiments, not all of the TEC devices 151 may be aligned with heat pipes 602. The TEC devices 151 may pump heat from components on chip 108 through thermal interface material 114 (which may be, for example, between the TEC devices 151 and the chip 108). Heat from the TEC devices 151 of the TEC device array 106 may evaporate fluid (e.g., water, acetone, or methanol) in the heat pipes 602 as the fluid absorbs heat. The fluid may vaporize and rise to the top of the heat pipes 602 and then condense as it releases its heat (e.g., to the heat sink fins). The condensed fluid may return to the bottom of the heat pipes 602 where it again absorbs heat to become a vapor. In some embodiments, the interior of the heat pipes 602 may be lined with a wick for returning the fluid to the bottom of the heat pipes 602. In some embodiments, the heat pipes 602 may be closely coupled to the TEC devices 151 to increase heat transfer from the TEC devices 151 to the heat pipes 602.

Figure 6B:
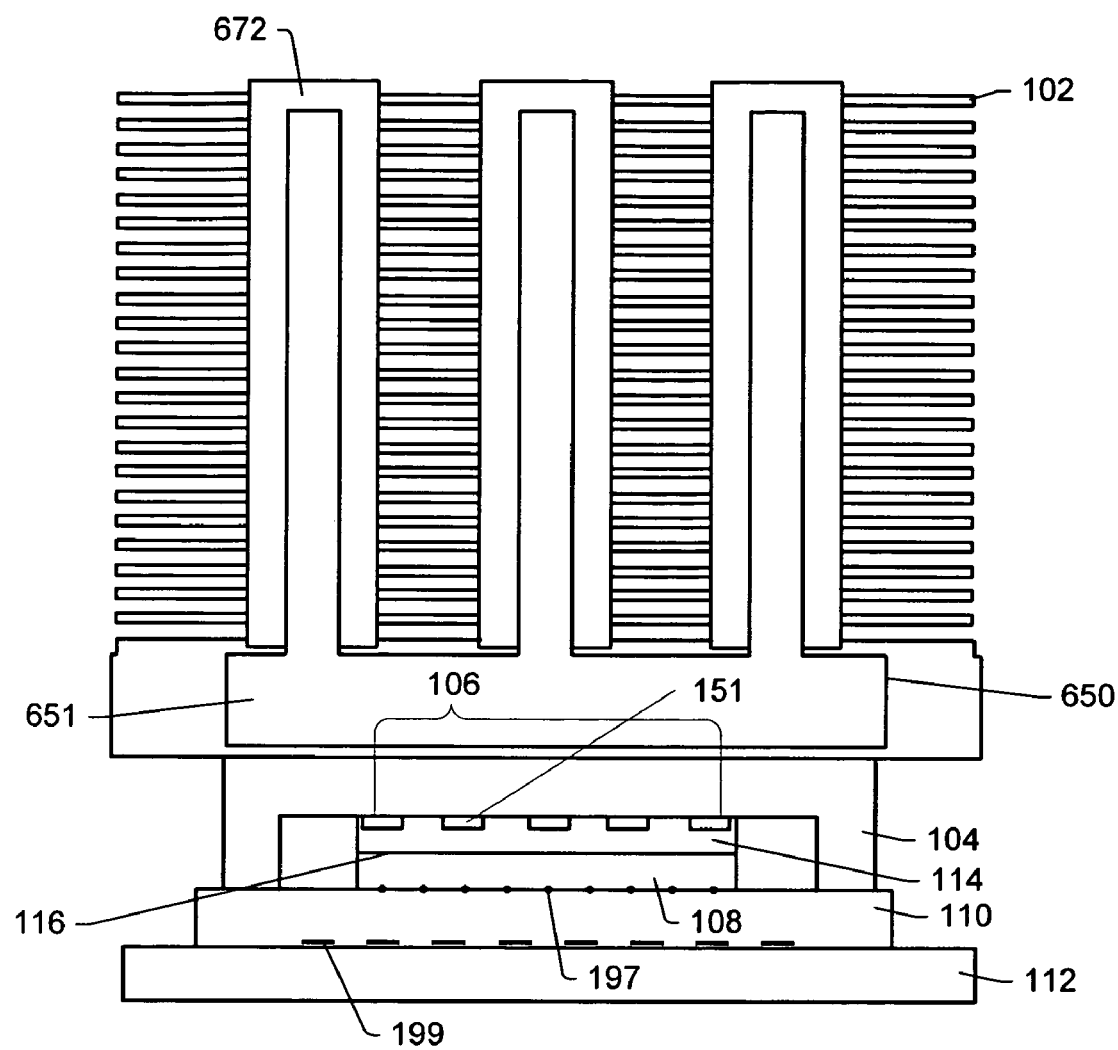
FIG. 6b illustrates a heat sink with an integrated cavity connected to multiple heat pipes, according to an embodiment.

FIG. 6b illustrates an embodiment of a cooling assembly with a heat sink 102 with an integrated cavity 650 connected to multiple heat pipes 672. In some embodiments, a cavity 650 may be provided for heat pipe fluid 651. As the fluid 651 absorbs heat from the TEC devices 151 coupled to package lid 104, the fluid 651 may vaporize and rise up one or more of the heat pipes 672. The vapor may release heat into the heat sink 102, and the fluid 651 may fall back into the cavity 650 to be heated again. In some embodiments, multiple cavities may be used. For example, one cavity with a first type of fluid may be positioned over a low heat generation area of the chip 108 while a different cavity with a different fluid may be positioned in a high heat generation area.

Figure 6C:
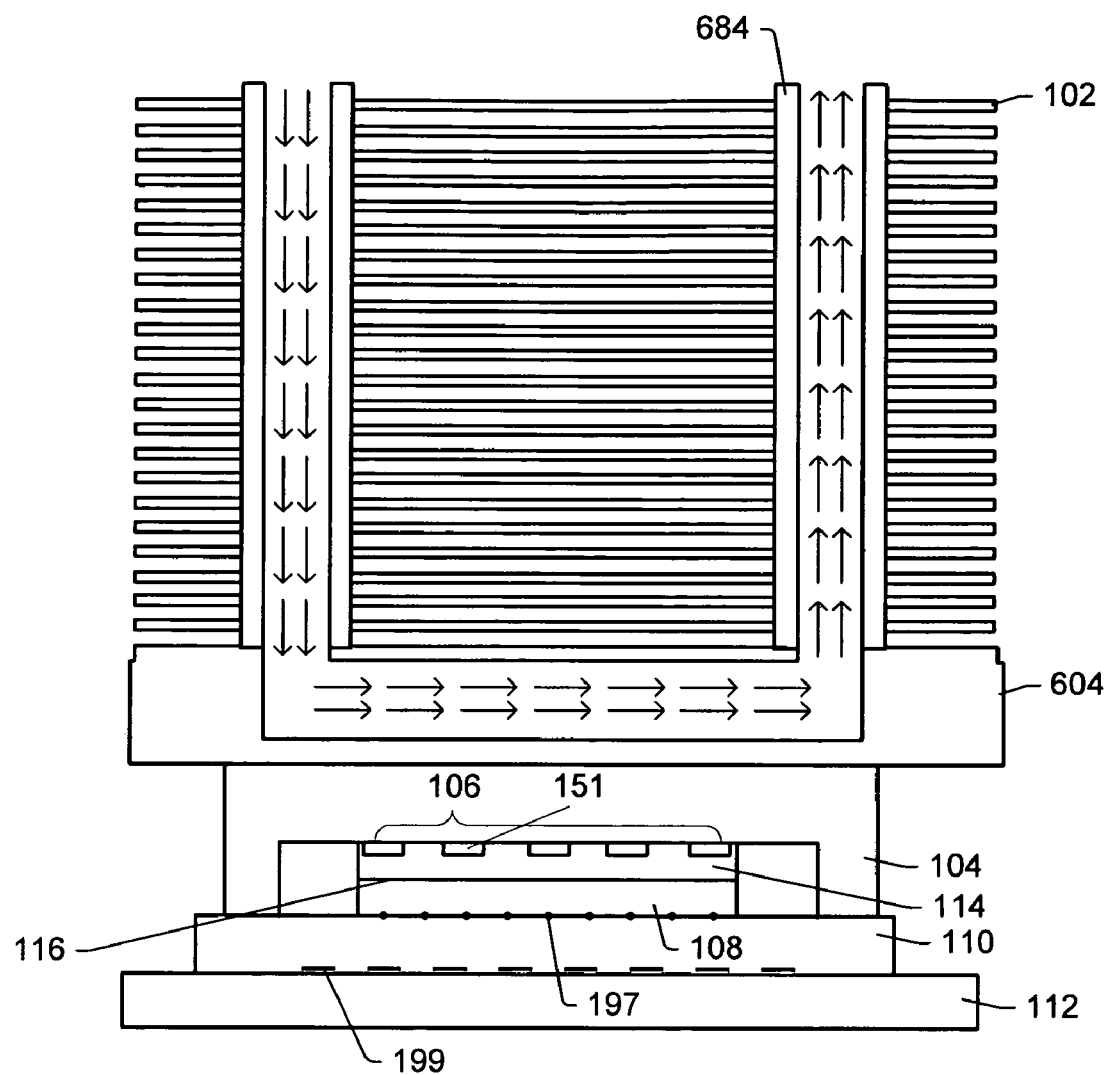
FIG. 6c illustrates a heat sink with an integrated liquid cooling pipe, according to an embodiment.

FIG. 6c illustrates an embodiment of the cooling assembly with a heat sink 102 with an integrated liquid cooling pipe 684. In some embodiments, fluid (e.g., water) may be pumped through the liquid cooling pipe(s) 684, heated by heat absorbed through heat sink base 604 from the TEC devices 151, and then pumped back out of the heat sink 102 to remove the absorbed heat from the assembly. Thermal interface material 114 may be used around the TEC devices 151 and/or in between the TEC devices 151 and the chip 108. Thermal interface material 114 may also be used between the TEC devices 151 and the heat sink 102.

Figure 7A:
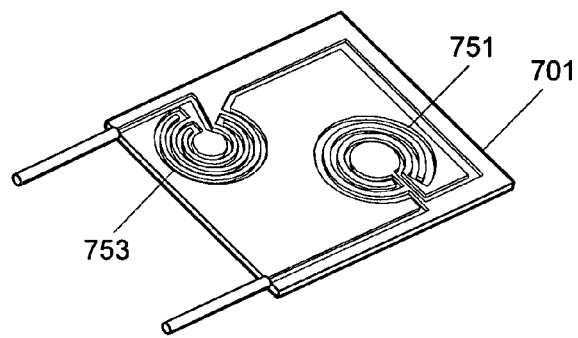
FIGS. 7a-e illustrate embodiments of liquid cooling components used with a heat sink.
Figure 7B:
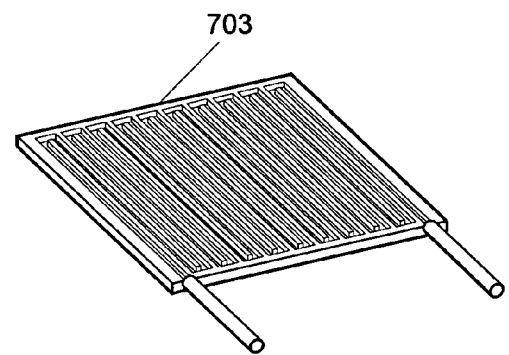
Figure 7C:
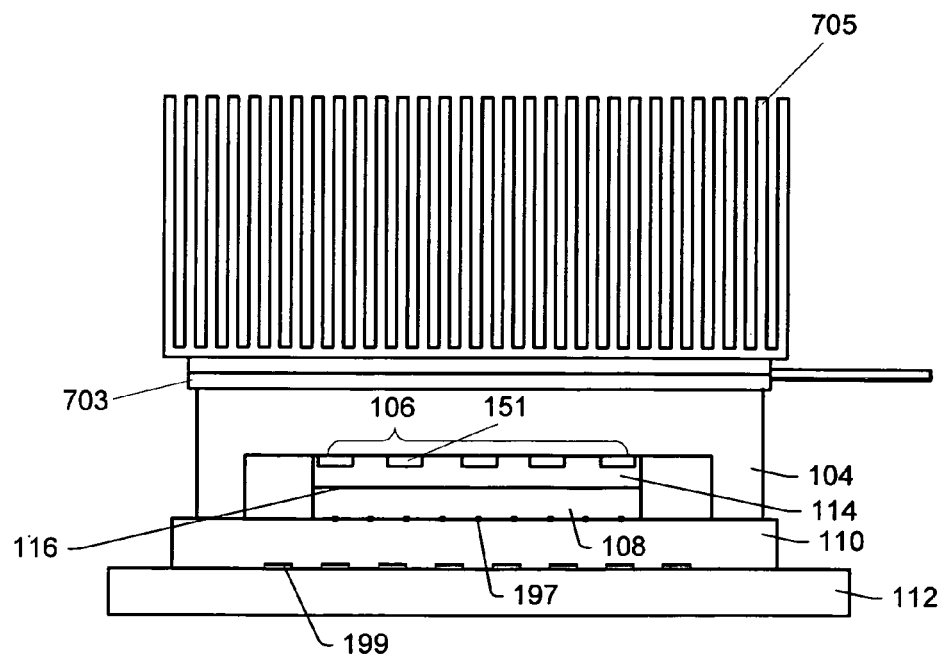

FIGS. 7a-e illustrate embodiments of liquid cooling components used with a heat sink. In some embodiments, a liquid cooling component may be used with the TEC device array 106 to enhance cooling of the chip 108. FIG. 7a shows a bottom plate of a liquid cooling component 701 that can be used for enhanced localized cooling (e.g., in regions 751 and 753). A cooling liquid may be circulated (e.g., with a pump) through the channels shown on the liquid cooling component 701 (between a top and bottom plate). FIG. 7b illustrates a bottom plate of a liquid cooling component 703 for more uniform additional cooling across the entire plate. FIG. 7c illustrates a side view of a heat sink 705, liquid cooling component 703 with a top and bottom plate, a package lid 104, a TEC device array 106, and a chip 108. Heat from the TEC device array 106 may be passed through to the liquid cooling-component 703 and the heat sink 705.

Figure 7D:
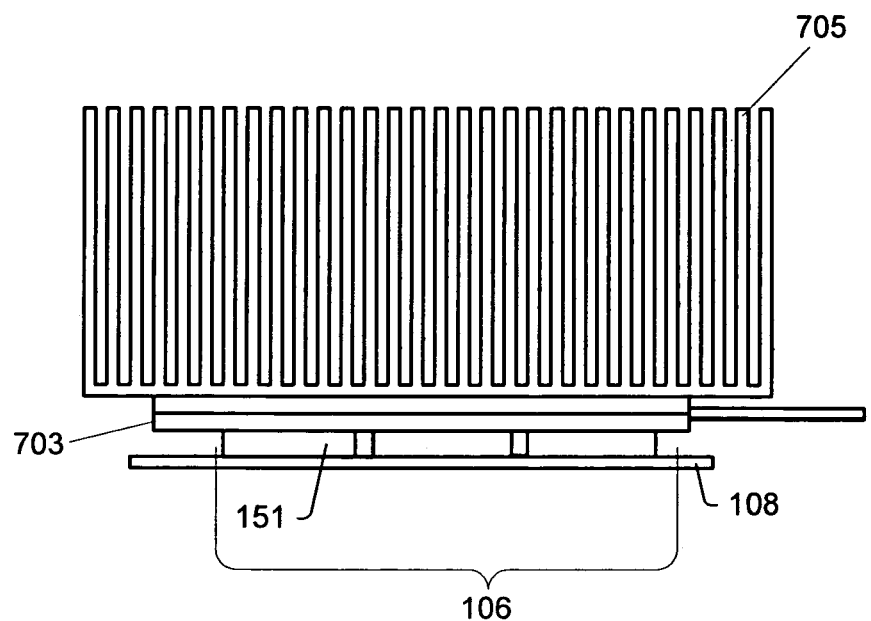
Figure 7E:
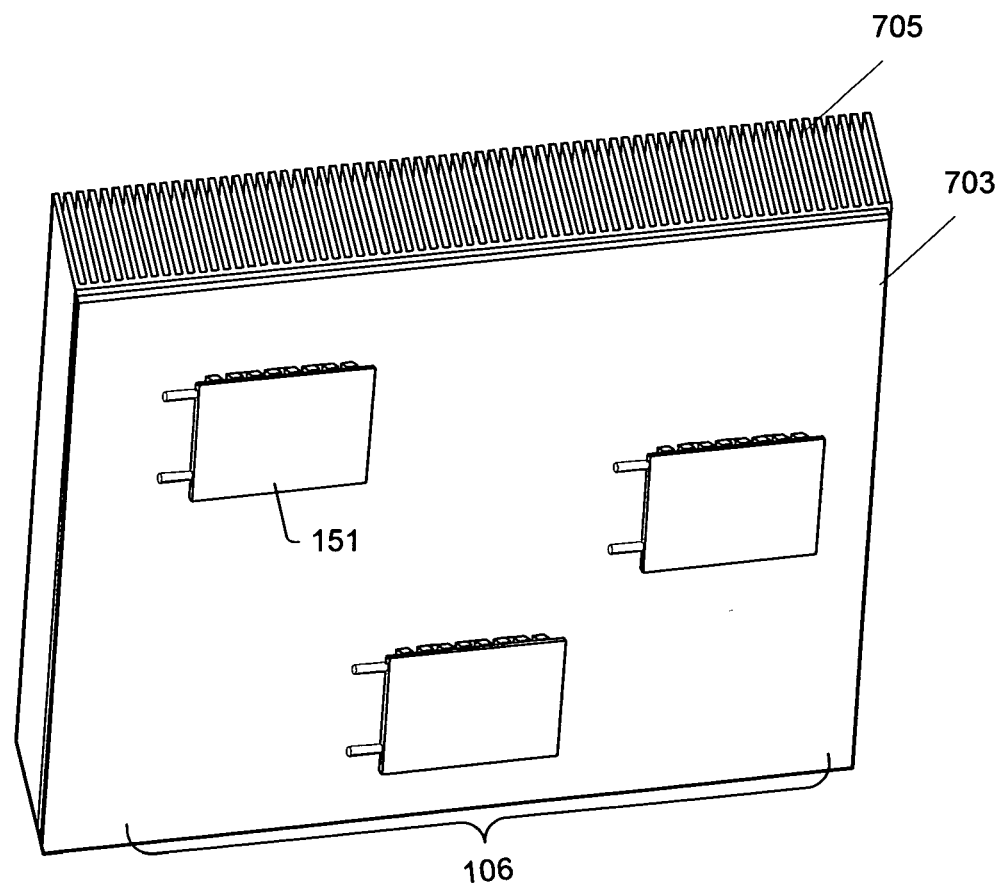

As seen in FIG. 7d, in some embodiments, the cooling assembly may not include a package lid 104. TEC device arrays 106 may be used in various assemblies without a package lid 104 (e.g., the TEC devices 151 may be attached to the chip 108). Other locations for the TEC devices 151 are also contemplated. In some embodiments, thermal interface material may be used between the liquid cooling component 703 and the heat sink 705 and/or between the liquid cooling component 703 and the TEC device array 106. Another view of the assembly shown in FIG. 7d is provided in FIG. 7e with the chip 108 removed for a clearer view of the bottom of the liquid cooling component 703 and TEC device array 106. TEC device array 106 may have TEC devices 151 placed to line up with regions on chip 108 for additional cooling and cooling control. Also, as seen in FIG. 7e, heat may be transferred from the TEC devices 151 out to a larger area of the liquid cooling component 703 to enable the heat to be removed more efficiently. Other configurations are also contemplated. Localized regions 751 and 753 of the liquid cooling component 701 may be paired with groups of TEC devices 151 in the TEC device array 106 for additional cooling over areas of the chip with higher heat generation.

In some embodiments, the flow of liquid in the liquid cooling component may be increased with magnetohydrodynamics (MHD). For example, if the liquid in the liquid cooling component is electrically conductive (e.g., liquid metal), an electric current can be applied to the liquid in the presence of a magnet to make the liquid move. In some embodiments, material may be added to the liquid in the liquid cooling component to make it electrically conductive. MHD may be used to move liquid through the liquid cooling component. In some embodiments, MHD may be used in place of or in addition to a pump for the liquid cooling component.

Figure 8:
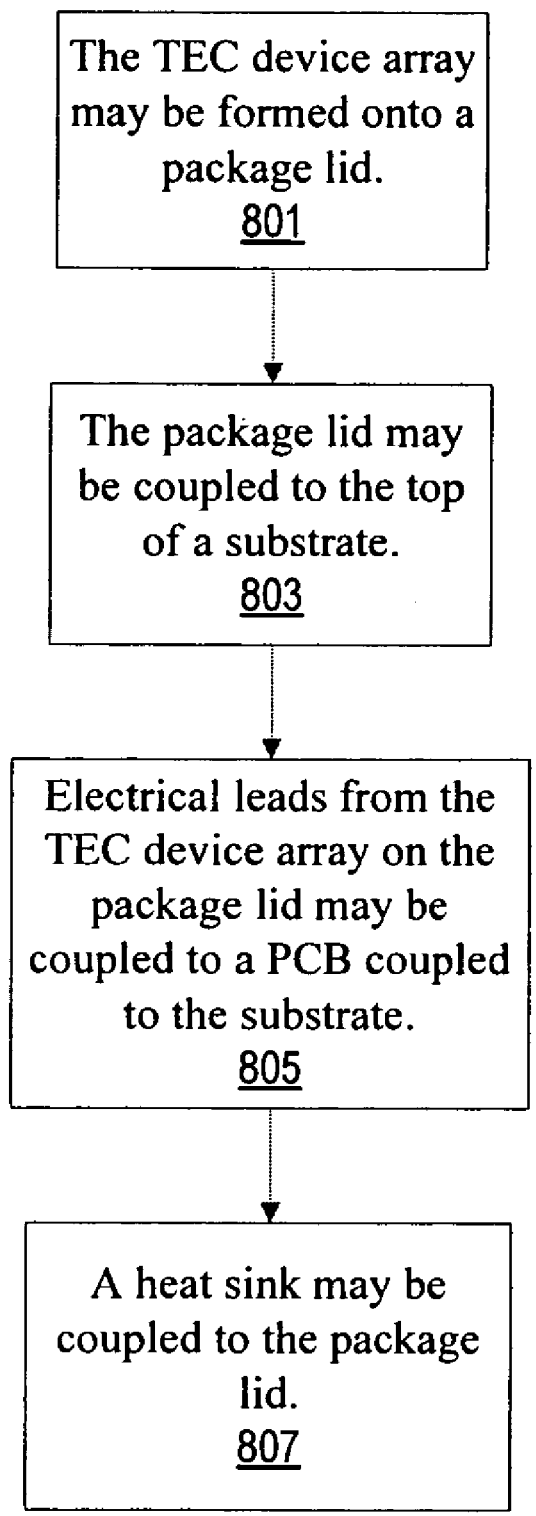
FIG. 8 illustrates a method for assembling a chip assembly including the TEC device array; according to an embodiment.

FIG. 8 illustrates an embodiment of a method for assembling a chip assembly including a TEC device array 106. It should be noted that in various embodiments of the methods described below, one or more of the elements described may be performed concurrently, in a different order than shown, or may be omitted entirely. Other additional elements may also be performed as desired.

At 801, the TEC device array 106 may be formed onto the package lid 104. In some embodiments, the placement of TEC devices 151 in the TEC device array 106 on the package lid 104 may correspond to the locations of components 409 in a chip 108 (e.g., a microprocessor) that the package lid 104 is designed to engage. In some embodiments, the placement of TEC devices 151 in the TEC device array 106 may correspond to areas of high heat generation on the chip 108 as pre-determined through testing and/or modeling. In some embodiments, the TEC devices 151 may be placed in a uniform array on the package lid 104.

At 803, the package lid 104 may be coupled to the top of a substrate 110. The package lid 104 may be placed on top of the chip 108 coupled to the substrate 110. In some embodiments, thermal sensors 419 may be attached and/or formed on the package lid 104 and/or chip 108 (e.g., in the electronic components 409).

At 805, electrical leads 204 from the TEC device array 106 on the package lid 104 may be coupled to the PCB 112 coupled to the substrate 110. The TEC devices 151 in the TEC device array 106 may be separately coupled to the electrical leads through electrical lines 208. In some embodiments, the electrical leads 204 may be coupled to the substrate 110 or to another portion of the assembly 100. The electrical leads 204 may be electrically coupled to a controller 303 (e.g., a MIMO controller). The controller 303 may also be electrically coupled to the thermal sensors 419 (e.g., through electrical connections/electrical paths from the thermal sensors 419 to the controller 303). The controller 303 may be located, for example, on the PCB 112, substrate 110, or chip 108. Other locations for the controller 303 are also contemplated.

At 807, a heat sink 102 may be coupled to the package lid 104. The heat sink 102 may include heat pipes 602 and/or a liquid cooling pipe 684. The heat sink 102 may be coupled to the package lid 104 through an adhesive. Other attachment mechanisms are also possible.

Figure 9:
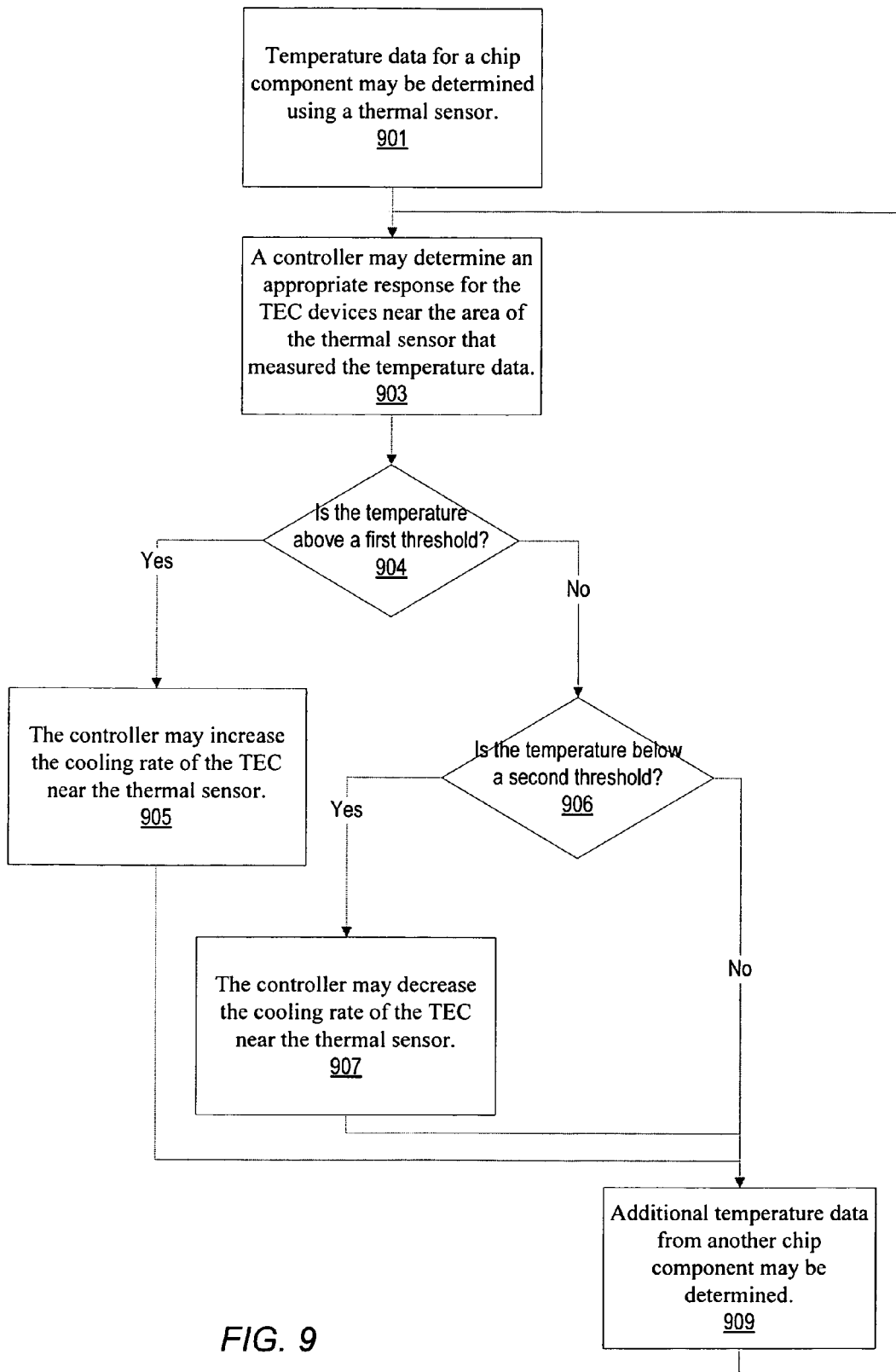
FIG. 9 illustrates a method of controlling a TEC device array, according to an embodiment.

FIG. 9 illustrates an embodiment of a method of controlling the TEC device array 106. It should be noted that in various embodiments of the methods described below, one or more of the elements described may be performed concurrently, in a different order than shown, or may be omitted entirely. Other additional elements may also be performed as desired.

At 901, temperature data for an electronic component 409 may be determined using a thermal sensor 419. For example, thermal sensor 419 on chip 108 may determine the temperature of an electronic component 409 (e.g., the thermal sensor 419 may be embedded in a microprocessor component). In some embodiments, the temperature of the electronic component 409 may not be directly determined, but instead the temperature of the area near the electronic component 409 may be determined (e.g., through a thermal sensor 419 formed on the chip 108 near the electronic component 409). In some embodiments, the thermal sensor 419 may not measure a temperature, but may determine other data related to temperature and/or heat transfer (this information may be used instead of or in addition to the temperature). The thermal sensor 419 may send the information through electrical connections to controller 303 (or the controller 303 may "read" the information through the thermal sensors 419).

At 903, a controller 303 may determine an appropriate response for the TEC devices 151 in TEC device array 106 near the area of the thermal sensor 419 that measured the temperature data.

At 904, a determination may be made as to whether the temperature is above a first threshold.

At 905, if the temperature is above a first threshold, the controller 303 may increase the cooling rate of the TEC devices 151 near the thermal sensor 419. In some embodiments, the controller 303 may compare a heat generation rate or other temperature related data to a threshold (instead of or in addition to comparing the temperature to a first threshold). In some embodiments, the controller 303 may specify operating parameters for the TEC devices 151 and/or may control power to the TEC devices 151. For example, if the controller 303 determines that a specific TEC device needs to increase its cooling rate, the controller 303 may directly increase the power supplied to the TEC device 151 by sending additional power through electrical lines to the TEC device 151.

At 906, if the temperature is not above a first threshold, the controller 303 may determine if the temperature is below a second threshold. In some embodiments, the controller may not determine if the temperature is below a second threshold.

At 907, if the temperature is below a second threshold, the controller 303 may decrease the cooling rate of the TEC devices 151 near the thermal sensor 419. In some embodiments, the first threshold and the second threshold may be approximately the same. In some embodiments, the thresholds may be different for different parts of the chip 108. In some embodiments, the controller 303 may dynamically change the thresholds for different chip conditions (e.g., the thresholds may be different at start-up than during a steady state operating condition).

At 909, additional temperature data from another electronic component 409 may be determined. In some embodiments, the temperature data for several electronic components 409 may be detected by separate thermal sensors 419 at approximately the same time.

Embodiments of a subset or all (and portions or all) of the above may be implemented by program instructions stored in a memory medium or carrier medium and executed by a processor (or, for example, the controller 303). A memory medium may include any of various types of memory devices or storage devices. The term "memory medium" is intended to include an installation medium, e.g., a Compact Disc Read Only Memory (CD-ROM), floppy disks, or tape device; a computer system memory or random access memory such as Dynamic Random Access Memory (DRAM), Double Data Rate Random Access Memory (DDR RAM), Static Random Access Memory (SRAM), Extended Data Out Random Access Memory (EDO RAM), Rambus Random Access Memory (RAM), etc.; or a non-volatile memory such as a magnetic media, e.g., a hard drive, or optical storage. The memory medium may comprise other types of memory as well, or combinations thereof. In addition, the memory medium may be located in a first computer in which the programs are executed, or may be located in a second different computer that connects to the first computer over a network, such as the Internet. In the latter instance, the second computer may provide program instructions to the first computer for execution. The term "memory medium" may include two or more memory mediums that may reside in different locations, e.g., in different computers that are connected over a network.

In some embodiments, a computer system at a respective participant location may include a memory medium(s) on which one or more computer programs or software components according to one embodiment of the present invention may be stored. For example, the memory medium may store one or more programs that are executable to perform the methods described herein. The memory medium may also store operating system software, as well as other software for operation of the computer system.

Further modifications and alternative embodiments of various aspects of the invention may be apparent to those skilled in the art in view of this description. Accordingly, this description is to be construed as illustrative only and is for the purpose of teaching those skilled in the art the general manner of carrying out the invention. It is to be understood that the forms of the invention shown and described herein are to be taken as embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. An apparatus, comprising:
    a plurality of thermoelectric cooling devices (TEC devices) forming a TEC device array; and
    a controller coupled to at least two TEC devices in the TEC device array;
    wherein the controller is operable to control a cooling rate of each of the at least two TEC devices in the TEC device array;
    wherein the controller is operable to control a cooling rate of at least one TEC device of the at least two TEC devices in the TEC device array separately from another TEC device of the at least two TEC devices in the TEC device array.

2. The apparatus of claim 1, further comprising at least one thermal sensor coupled to the controller, wherein the controller is operable to control the cooling rate of the at least one TEC device of the at least two TEC devices in the TEC device array in response to data from the at least one thermal sensor.

3. The apparatus of claim 2,
    wherein the at least one thermal sensor is operable to measure temperature data of an electronic component on a chip coupled to the TEC device array; and
    wherein the chip is a microprocessor.

4. The apparatus of claim 2,
    wherein the at least one thermal sensor is operable to measure temperature data of an electronic component on a chip coupled to the TEC device array; and
    wherein the TEC device array is operable to be coupled to a package lid coupled to the chip.

5. The apparatus of claim 1, wherein the controller is operable to separately control each TEC device of the at least two TEC devices in the TEC device array coupled to a chip to cool different respective areas of the chip associated with each TEC device of the at least two TEC devices at different respective cooling rates.

6. An apparatus, comprising:
    an electronic element comprising a plurality of electronic components;
    a plurality of thermoelectric cooling devices (TEC devices) forming a TEC device array coupled to the electronic element;
    a controller coupled to at least two TEC devices in the TEC device array; and
    a thermal sensor coupled to the controller;
    wherein the controller is operable to control a cooling rate of at least one TEC device of the at least two TEC devices in the TEC device array separately from another TEC device of the at least two TEC devices in the TEC device array.

7. The apparatus of claim 6, further comprising a package lid coupled to the electronic element, wherein the TEC device array is coupled to the package lid.

8. The apparatus of claim 7, further comprising a heat sink coupled to the package lid, wherein the heat sink is operable to remove heat from the TEC device array.

9. The apparatus of claim 8, wherein at least one TEC device of the TEC device array is placed on the package lid in a position for the at least one TEC device to be aligned with an electronic component on the electronic element when the package lid is coupled to the electronic element.

10. The apparatus of claim 6,
    wherein the electronic element emits heat in a non-uniform pattern over a surface of the electronic element; and
    wherein the non-uniform pattern comprises at least one lower heat generation area and at least one higher heat generation area.

11. The apparatus of claim 10,
    wherein the non-uniform pattern of heat emission changes over time; and
    wherein the controller is operable to adjust the cooling rate of the at least one TEC device of the at least two TEC devices in the TEC device array to increase uniformity of heat emission over the surface of the electronic element.

12. The apparatus of claim 6,
    wherein the thermal sensor is operable to measure temperature data of at least one electronic component in the plurality of electronic components; and
    wherein the controller is operable to control the cooling rate of the at least one TEC device of the at least two TEC devices in the TEC device array in response to the measured temperature data from the thermal sensor.

13. The apparatus of claim 12, wherein the thermal sensor is embedded in the at least one electronic component of the plurality of electronic components.

14. The apparatus of claim 6, further comprising a plurality of thermal sensors, wherein the plurality of thermal sensors includes the thermal sensor coupled to the controller, wherein, in response to a thermal sensor of the plurality of thermal sensors detecting an increase in temperature, the controller is operable to increase a cooling rate of a TEC device of the plurality of TEC devices near the thermal sensor of the plurality of thermal sensors detecting the increase in temperature.

15. The apparatus of claim 6, further comprising:
a plurality of thermal sensors, wherein the plurality of thermal sensors includes the thermal sensor coupled to the controller; and
wherein, in response to a thermal sensor of the plurality of thermal sensors detecting a decrease in temperature, the controller is operable to decrease a cooling rate of a TEC device of the plurality of TEC devices near the thermal sensor of the plurality of thermal sensors detecting the decrease in temperature.

16. An apparatus, comprising:
an electronic element, wherein the electronic element comprises a plurality of electronic components;
a package lid coupled to the electronic element;
a heat sink coupled to the package lid, wherein the heat sink is operable to remove heat from the package lid;
a plurality of TEC devices, forming a TEC device array, coupled to the package lid, wherein the TEC device array is operable to transfer heat from the electronic components to the package lid; and
a controller coupled to at least two TEC devices in the TEC device array;
wherein the controller is operable to control a cooling rate of at least one TEC device of the at least two TEC devices in the TEC device array separately from another TEC device of the at least two TEC devices in the TEC device array.

17. The apparatus of claim 16, further comprising:
a thermal sensor coupled to at least one electronic component of the plurality of electronic components and to the controller;
wherein the thermal sensor is operable to measure temperature data of the at least one electronic component of the plurality of electronic components; and
wherein the controller is operable to control the cooling rate of the at least one TEC device of the at least two TEC devices in the TEC device array separately from another TEC device of the at least two TEC devices in the TEC device array in response to the measured temperature data from the thermal sensor.

18. The apparatus of claim 16, wherein the heat sink further comprises a liquid heat pump.

19. The apparatus of claim 16, wherein the heat sink further comprises a plurality of heat pipes, wherein at least one of the plurality of heat pipes are aligned with at least one TEC device in the plurality of TEC devices.

20. The apparatus of claim 16, further comprising a printed circuit board (PCB) coupled to the electronic element.

* * * * *